US012724946B2

(12) United States Patent
Samson et al.

(10) Patent No.: US 12,724,946 B2
(45) Date of Patent: Sep. 1, 2026

(54) FAST FRONT TRACKING IN EOR FLOODING SIMULATION ON COARSE GRIDS

(71) Applicant: SCHLUMBERGER TECHNOLOGY CORPORATION, Sugar Land, TX (US)

(72) Inventors: Barys Andreevich Samson, Piddington (GB); Sophie Nazik Godefroy, Abingdon (GB); Soham Sheth, Oxford (GB); Christopher Marooney, Abingdon (GB)

(73) Assignee: Schlumberger Technology Corporation, Sugar Land, TX (US)

( * ) Notice: Subject to any disclaimer, the term of this patent is extended or adjusted under 35 U.S.C. 154(b) by 1031 days.

(21) Appl. No.: 17/905,707

(22) PCT Filed: Mar. 3, 2021

(86) PCT No.: PCT/US2021/020610
§ 371 (c)(1),
(2) Date: Sep. 6, 2022

(87) PCT Pub. No.: WO2021/183336
PCT Pub. Date: Sep. 16, 2021

(65) Prior Publication Data

US 2023/0104036 A1 Apr. 6, 2023

Related U.S. Application Data

(60) Provisional application No. 62/986,872, filed on Mar. 9, 2020.

(51) Int. Cl.
*G06F 30/27* (2020.01)
*E21B 43/16* (2006.01)

(52) U.S. Cl.
CPC ............ *G06F 30/27* (2020.01); *E21B 43/162* (2013.01); *E21B 2200/20* (2020.05)

(58) Field of Classification Search
CPC ..... G06F 30/27; E21B 43/162; E21B 2200/20
(Continued)

(56) References Cited

U.S. PATENT DOCUMENTS 8,301,429 B2 * 10/2012 Hajibeygi ............... G06F 30/23 702/33
8,725,477 B2 * 5/2014 Zhang ..................... E21B 49/00 73/152.02

(Continued)

FOREIGN PATENT DOCUMENTS

EP 3671290 A1 6/2020
WO 2012015516 A1 2/2012

OTHER PUBLICATIONS

Nilsson et al. (A Novel Adaptive Anisotropic Grid framework for Efficient Reservoir Simulation, 2005, SPE, pp. 1-23) (Year: 2005).*

(Continued)

*Primary Examiner* — Iftekhar A Khan
(74) *Attorney, Agent, or Firm* — Kyle R. Miiller

(57) ABSTRACT

The present disclosure provides a workflow for modelling EOR flooding operations performed on a reservoir by separating front tracking from the reservoir simulation process, so that the front's position and topology evolves in parallel with the coarse grid simulation, through modifications using machine-learning-trained correlations.

27 Claims, 12 Drawing Sheets

(58) Field of Classification Search
USPC .............................................................. 703/6
See application file for complete search history.

(56) References Cited

U.S. PATENT DOCUMENTS

| | | | | |
|---|---|---|---|---|
| 8,798,977 | B2 * | 8/2014 | Hajibeygi | G06F 17/11 703/10 |
| 9,187,984 | B2 * | 11/2015 | Usadi | G06F 30/23 |
| 10,060,245 | B2 * | 8/2018 | Cullick | E21B 43/30 |
| 10,208,577 | B2 * | 2/2019 | Hoteit | E21B 43/00 |
| 10,209,401 | B2 * | 2/2019 | Ronot | G06N 20/00 |
| 10,519,766 | B2 * | 12/2019 | Hu | E21B 49/00 |
| 11,680,465 | B2 * | 6/2023 | Albinali | G01V 20/00 166/250.01 |
| 11,754,745 | B2 * | 9/2023 | Kayum | E21B 49/00 703/10 |
| 11,781,416 | B2 * | 10/2023 | Bakulin | G06N 20/00 702/9 |
| 2008/0046223 | A1 * | 2/2008 | Noetinger | E21B 43/20 703/9 |
| 2010/0132450 | A1 * | 6/2010 | Pomerantz | G01N 33/2823 73/152.28 |
| 2010/0138196 | A1 * | 6/2010 | Hui | E21B 49/00 703/1 |
| 2010/0179797 | A1 * | 7/2010 | Cullick | E21B 43/30 703/10 |
| 2010/0185428 | A1 * | 7/2010 | Vink | G01V 99/00 703/10 |
| 2012/0158378 | A1 * | 6/2012 | Enchery | G01V 11/00 703/2 |
| 2012/0179443 | A1 * | 7/2012 | Van Batenburg | E21B 43/16 703/10 |
| 2012/0232859 | A1 * | 9/2012 | Pomerantz | G01V 1/282 703/2 |
| 2013/0118736 | A1 * | 5/2013 | Usadi | G06F 30/23 166/268 |
| 2013/0226540 | A1 * | 8/2013 | Pita | G06F 30/23 703/2 |
| 2013/0245952 | A1 * | 9/2013 | Lin | E21B 49/008 702/12 |
| 2014/0257577 | A1 * | 9/2014 | Prange | E21B 43/12 703/2 |
| 2015/0100293 | A1 * | 4/2015 | Hoteit | E21B 43/16 703/10 |
| 2019/0040724 | A1 * | 2/2019 | Dykstra | E21B 43/20 |
| 2019/0094199 | A1 * | 3/2019 | Shi | E21B 43/162 |
| 2019/0095792 | A1 * | 3/2019 | Kashinath | G06N 3/08 |
| 2020/0202056 | A1 * | 6/2020 | Samson | G01V 20/00 |

OTHER PUBLICATIONS

International Preliminary Report on Patentability of International Patent Application No. PCT/US2021/020610 issued Sep. 22, 2022, 7 pages.

Christensen et al., "Applications of Dynamic Gridding to Thermal Simulations", Society of Petroleum Engineers, SPE 86969-MS, 2004, 10 pages.

Sammon, "Dynamic Grid Refinement and Amalgamation for Compositional Simulation", Society of Petroleum Engineers, SPE 79683, 2003, 11 pages.

Berger and Colella, "Local Adaptive Mesh Refinement for Shock Hydrodynamics", Journal of Computational Physics, vol. 82, pp. 64-84, 1989.

Hornung and Trangenstein, "Adaptive Mesh Refinement and Multilevel Iteration for Flow in Porous Media", Journal of Computational Physics, vol. 136, pp. 522-545, 1997.

Cusini et al., "Algebraic dynamic multilevel (ADM) method for fully implicit simulations of multiphase flow in porous media", Journal of Computational Physics, vol. 314, pp. 60-79, 2016.

Mostaghimi et a., "A Dynamic Mesh Approach for Simulation of Immiscible Viscous Fingering", Society of Petroleum Engineers, SPE-173281-MS, 2015, 12 pages.

Van Batenburg et al., "Application of Dynamic Gridding Techniques to IOR/EOR-Processes", Society of Petroleum Engineers, SPE 141711, 2011, 16 pages.

Gonzalez, "Adaptive Grid Refinement Improves Gas Injection Modeling", Society of Petroleum Engineers, Spe 184487-STU, 2016, 18 pages.

Wikipedia, "Random forest", 12 pages, accessed Sep. 2, 2022, available at: https://en.wikipedia.org/wiki/Random_forest.

Search Report and Written Opinion of International Patent Application No. PCT/US2021/020610 issued on Jun. 8, 2021; 11 pages.

Extended Search Report issued in European Patent Application No. 21767183.3 dated Feb. 19, 2024, 7 pages.

Samson, B. et al., "Machine Learning for Fast EOR Flooding Simulation", 17th Annual European Conference on the Mathematics of Oil Recovery, 2020, 13 pages.

* cited by examiner

FAST FRONT TRACKING IN EOR FLOODING SIMULATION ON COARSE GRIDS

CROSS-REFERENCE TO RELATED APPLICATION(S)

The present disclosure is a National Stage Entry of International Application No. PCT/US2021/020610, filed Mar. 3, 2021, which claims priority from U.S. Provisional Pat. Appl. Ser. No. 62/986,872, filed on Mar. 9, 2020, herein incorporated by reference in its entirety.

FIELD

The present disclosure relates to simulation of enhanced oil recovery (EOR) processes performed on a reservoir. More particularly, the present disclosure relates to simulation of EOR flooding operations performed on a reservoir.

BACKGROUND

One of the essential elements of oil and gas field development planning (FDP) is running uncertainty and optimization workflows using reservoir simulation. It is needed for investigating and determining optimal configurations of wells and their operation schedules as well as history matching to determine reservoir properties poorly defined from reservoir development history, if available. In the context of Enhanced Oil Recovery (EOR) processes performed on a reservoir, various EOR screening workflows employ multiple fast simulation runs.

A common feature of EOR processes, particularly EOR flooding operations, is the formation of a sharp advancing front of the displacing agent (water, polymers, surfactants, etc.) which sweeps the reservoir. Standard accurate numerical modeling of the front would usually need a fine scale grid to capture the front gradients. Without dynamic re-gridding methods, this would require a fine scale grid across the whole reservoir, slowing down the simulations and making it difficult to launch many runs.

Use of coarsened grids which are the result of geological properties upscaling seems to be a preferred way to speed up the simulation. Reduction of active grid cells number by a factor of N would speed up the calculation approximately as $O(N^\alpha)$, where $\alpha \in [1.3,2]$. However, larger grid cells lead to a sharp increase of numerical dispersion error. Besides, the flooding front shape gradients are closely connected with the front propagation speed. Therefore, the coarse grids would reduce significantly the accuracy of numerical predictions, which is a very important factor in estimating oil recovery figures in fields with EOR flooding.

The dilemma between receiving fast results on coarse grid simulation and necessity of grid refinement for accuracy and capturing fine geological features is a subject of intensive research in the reservoir simulation engineering community.

The main efforts so far attempt to use various methods for local grid refinement. The idea is to ensure that in the simulation the front propagates across adequately for the accuracy refined grid, while other, less demanding parts of the reservoir, are simulated on a sufficiently coarsened grid. There are two main problems that need to be solved. One is the necessity of local grid refinement with physical properties being transferred between different scale grids. Such physical property transfer takes time, and in practice, these additional steps, together with still unavoidable large presence of fine grid, may kill speed advantages provided by the coarser grid. It is difficult to see clearly the advantages of the dynamic refinement. In addition, modern commercial simulators are architecturally too rigid to employ the benefits of the re-gridding. The other problem is the necessity to predict the front position, which would minimize the fraction of the fine grid to be inserted, preferably at the exact location of the expected front arrival.

In J. R. Christensen, G. Darche, B. Dechelette, H. Ma, P. H. Sammon, "Applications of Dynamic Gridding to Thermal Simulations," SPE 86969-MS, 2004, and P. H. Sammon, "Dynamic Grid Refinement and Amalgamation for Compositional Simulation," SPE 79683, 2003, the authors suggest using amalgamation of initially fine grid into coarser cells when properties gradients are not significant. Reversal of the amalgamation—refinement down to the original fine scale, takes place when the steep fronts are nearby. The grid manipulations are dealing with just two levels of refinement. The method was successfully applied for thermal and compositional simulations.

In M. J. Berger and P. Colella, "Local Adaptive mesh refinement for shock hydrodynamics," J. Comp. Physics. 82, 64 (1989), an adaptive local mesh refinement algorithm was developed for unsteady gas dynamics. In R. D. Hornung and J. A, Trangenstein, "Adaptive Mesh Refinement and Multi-level Iteration for Flow in Porous Media," J. Comp. Physics. 136, 522-545 (1997), this method was extended to provide Adaptive Mesh Refinement (AMR) for incompressible flow in porous media. The AMR method implies a presence of several levels of refinement.

In M. Cusini, C. van Kruijsdijk, and H. Hajibeygi, "Algebraic dynamic multilevel (ADM) method for fully implicit simulations of multiphase flow in porous media," Journal of Computational Physics, 314, 60-79 (2016), a similar, Algebraic Dynamic Multilevel (ADM) method has been proposed for fully implicit simulation. The ADM method offers a hierarchy of nested grids of different resolutions, the decision on which grid to use is based on an error estimate criterion.

In P. Mostaghimi, F. Kamali, M. D. Jackson, A. H. Muggeridge, and C. C. Pain, "A Dynamic Mesh Approach for Simulation of Immiscible Viscous Fingering," SPE-173281-MS, 2015, another approach, called Adaptive Mesh Control Volume Finite Element or CFVE was described. The CFVE method uses constantly morphed triangular anisotropic mesh re-generation, with scale and topology driven by evolving in time front of concentration as shown in FIGS. 1A and 1B.

In D. W. van Batenburg, M. Bosch, P. M. Boerrigter, A. H. de Zwart, and J. C. Vink, "Application of Dynamic Gridding Techniques to IOR/EOR-Processes," SPE 141711, 2011, one of the leanest algorithms for dynamic grid generation called Dynamic Local Grid Refinement (DLGR) is presented. The DLGR method uses a geometrical construction called octree.

One needs to remember that the refinement process takes the refined area closer to its original geological granularity, the coarse cells and domains are nothing more than initially upscaled parts of feature-rich rock structure. Therefore, it is important to reiterate that the down-scaling of the upscaled grid around the frontline would be both minimizing numerical errors caused by the front steepness, and restoring the front propagation sensitivity to the fine-scale reservoir features.

One of the most important challenges in dynamic grid refinement is to predict where the front will be at the next time step, to have an ability to refine the grid exactly where the front is expected. It would be particularly difficult to predict the future front position in numerical simulations using implicit solvers. In this case the length of timestep is not limited by stability requirements, therefore current and future fronts can be quite far apart.

There were some solutions for this problem suggested in literature.

For example, in the ADM method of Cusini, van Kruijsdijk, and Hajibeygi duplicates the system advance every time step. After the first timestep on the "old" grid, the states and inter-cell fluxes are analyzed, and the front position is predicted as the result. The grid is refined according to this prediction, and the timestep is repeated.

In another example, in the DLGR method of van Batenburg, Bosch, Boerrigter, de Zwart, and Vink, a Newton-Raphson iteration is used to make a prediction about front position after performing a timestep on a fixed grid, with further grid modification and another timestep.

In still another example, Karin G. Gonzalez in "Adaptive Grid Refinement Improves Gas Injection Modeling," SPE 184487-STU, 2016, implies a streamline simulation run of a reservoir model. The streamline run is a lighter version of the full discretized model, and it allows the ability to monitor the agent concentration front propagation along one-dimensional streamlines. The front position along a set of streamlines then mapped into a cell model, with the octree grid refinement around the front.

To summarize, adaptive grid refinement methods still attract an interest from researchers. Nevertheless, they still have a common set of drawbacks, namely:

- the runtime speedup with respect to the fine grid simulation is difficult to quantify, especially in comparison with available commercial simulators; and
- it is still a problem to predict where to expect the front at the next timestep. Knowing this location would make it much easier to carry out lean grid refinement.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

The present disclosure provides a workflow for modeling and simulating EOR flooding operations performed on a reservoir by separating front tracking from the reservoir simulation process, so that the front's position and topology evolves in parallel with coarse grid simulation, through modifications using machine-learning-trained correlations.

In the workflow, the machine learning system is trained using training data obtained from a representative fine grid simulation of EOR flooding operations. The front propagation and deformation learned by the machine learning system is dependent on an array of localized static reservoir properties (e.g., permeabilities, porosity) and localized dynamic reservoir properties (e.g., pressure gradients, fluid saturations, etc.). These properties are produced by the coarse grid simulation process where the trained model is applied. The front position is thus adjusted, giving its next time step position. Small-scale geological reservoir features can be honored by refining front position using the same trained machine learning system. The simulation time of the workflow is defined by the course grid simulation, which is fast enough to be used in uncertainty and optimization workflows.

In embodiments, the machine learning system can be trained to predict at least one parameter characterizing a displacing agent front in the course grid for a time step in the course grid simulation process. For example, the at least one parameter characterizing the displacing agent front can represent a front speed for the time step.

In embodiments, the machine learning system can be trained to predict front speed for the time step given at least one localized static property of the reservoir, at least one localized dynamic property of the reservoir at the time step provided by the course grid simulation process, and at least one localized dynamic property of the reservoir at an earlier time step provided by the course grid simulation process. For example, the at least one localized static property of the reservoir can be selected from the group consisting of porosity and anisotropic permeabilities of the reservoir a cell of the course grid. In another example, the at least one localized dynamic property of the reservoir at the time step can be selected from the group consisting of anisotropic pressure gradients, fluid saturations and displacing agent concentration at a cell of the course grid at the time step, and the at least one localized dynamic property of the reservoir at the earlier time step can be selected from the group consisting of anisotropic pressure gradients, fluid saturations and displacing agent concentration at a cell of the course grid at the earlier time step.

In embodiments, the machine learning system can be trained to predict the front speed for the time step given front parameter data from an earlier time step. For example, the front parameter data can represent at least one of position of the front relative to center position of the group of cells, orientation of the front, and curvature of the front at the earlier time step. The front parameter data can be derived from the representative fine grid simulation of EOR flooding operations.

In embodiments, the coarse grid front speed for the time step can be extracted from the course grid simulation, and the front speed for the time step as predicted by the machine learning system and the coarse grid front speed can be to update at least one localized static property of the reservoir. For example, the at least one localized static property of the reservoir can include anisotropic permeability of the reservoir at one more cells of the course grid.

In embodiments, the machine learning system can be trained using a random forest algorithm.

In embodiments, the machine learning system can be trained using training data based on at least one localized static property of the reservoir derived by upscaling data representing the at least one static property for a group of adjacent cells of the first grid, wherein the group of adjacent cells of the first grid is defined by a predefined stencil. For example, the at least one localized static property can be selected from the group consisting of porosity and anisotropic permeabilities of the reservoir.

In embodiments, the machine learning system can be trained using training data based on at least one localized dynamic property of the reservoir derived by upscaling data representing the at least one dynamic property for a group of adjacent cells of the first grid for respective time steps of a pair of time steps, wherein the group of adjacent cells of the first grid is defined by a predefined stencil. For example, the at least one localized dynamic property can be selected from the group consisting of pressure gradients, fluid saturations, and displacing agent concentration.

In embodiments, the machine learning system can be trained using training data based on output data of a reservoir simulator that is configured to simulate representative EOR flooding operations using a fine grid having relatively high resolution, and the course grid simulation process can be performed by a reservoir simulator configured to simulate EOR flooding operations using the course grid having a relatively low resolution.

BRIEF DESCRIPTION OF THE DRAWINGS

The subject disclosure is further described in the detailed description which follows, in reference to the noted plurality of drawings by way of non-limiting examples of the subject disclosure, in which like reference numerals represent similar parts throughout the several views of the drawings.

DETAILED DESCRIPTION

The particulars shown herein are by way of example and for purposes of illustrative discussion of the embodiments of the subject disclosure only and are presented in the cause of providing what is believed to be the most useful and readily understood description of the principles and conceptual aspects of the subject disclosure. In this regard, no attempt is made to show structural details in more detail than is necessary for the fundamental understanding of the subject disclosure, the description taken with the drawings making apparent to those skilled in the art how the several forms of the subject disclosure may be embodied in practice. Furthermore, like reference numbers and designations in the various drawings indicate like elements.

Figure 3:
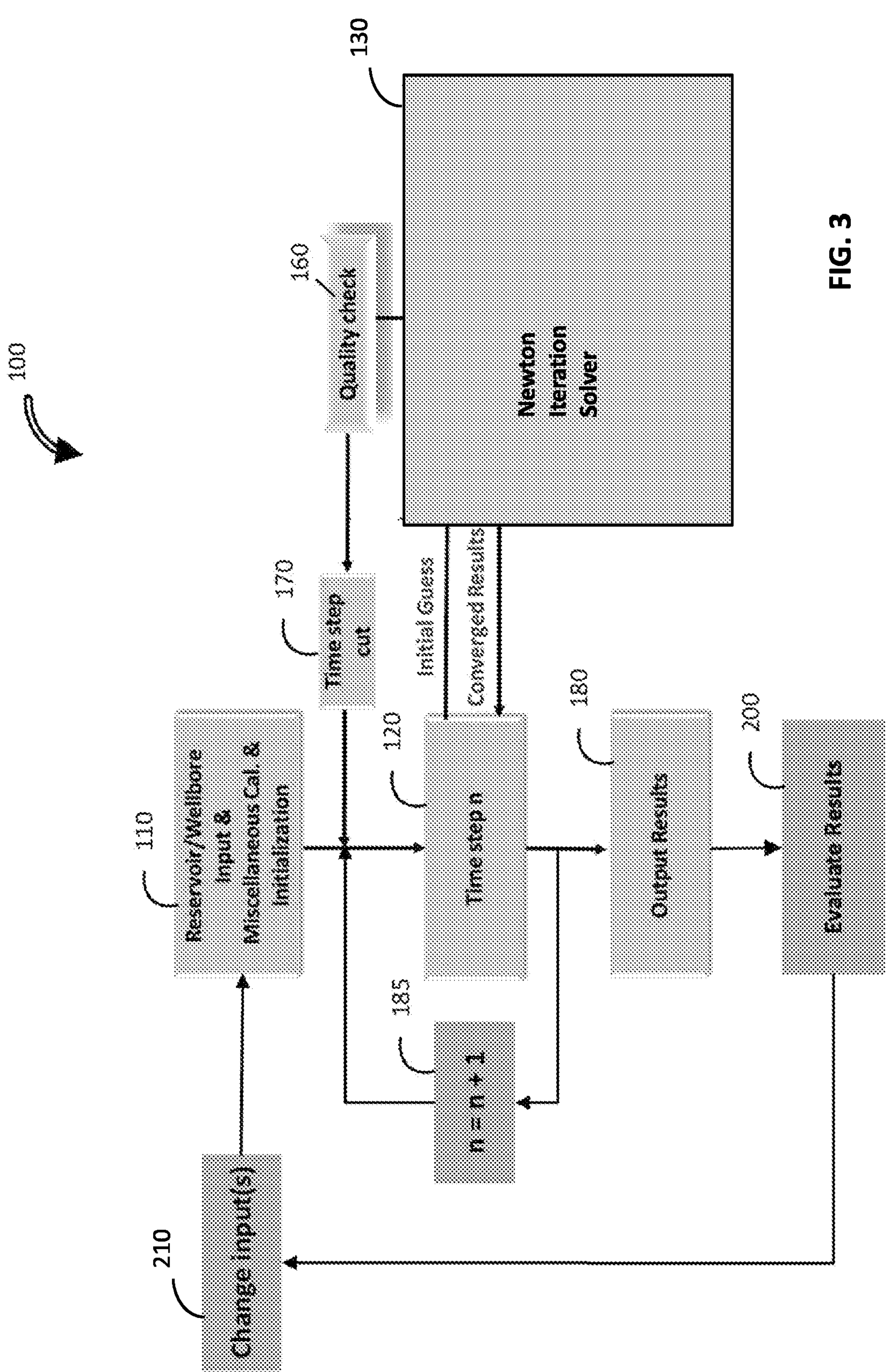
FIG. 3 is a high-level schematic diagram of an example reservoir simulator and its operation.

Turning to FIG. 3, a high-level schematic diagram is provided of a reservoir simulator 100. The reservoir simulator 100 is a processor-based system that employs a discrete form of a system of partial differential equations to model multi-phase, multiple component fluid flow in natural porous media (i.e., a reservoir). The reservoir simulator 100 can also model fluid flow from the reservoir to connected wellbore(s) and/or other associated production systems. The fluid in the reservoir typically includes three fluid phases: oil phase, gas phase, and water phase. Each fluid phase may contain different amounts of components, such as hydrocarbon components, carbon dioxide, hydrogen sulfide, nitrogen, and water. The governing equations typically used to describe the fluid flow in the reservoir are based on the assumption of thermodynamic equilibrium and the principles of conservation of mass, momentum, and energy. The complexity of the physics that govern the fluid flow leads to systems of coupled nonlinear partial differential equations that are not amenable to conventional analytical methods. As a result, numerical solution techniques are necessary. The numerical solution techniques divide the reservoir into computational elements (e.g., a grid of cells) that cover the spatial extent of the reservoir and divide time into time intervals or time steps (e.g., days or months). At each time step, the coupled system of nonlinear equations is solved using Newton's method, which is an iterative method where the approximate solution to the nonlinear system is obtained by an iterative process of linearization, linear system solution and updating.

At 110, information regarding the reservoir and possibly one or more wellbores that penetrate the reservoir (such as one or more injector wells and one or more producer wells, which can be drilled or are a candidate for drilling), is input into the reservoir simulator 100. Such information can include location and properties of geological structures in the reservoir, initial distributions of reservoir fluid properties, such as volume fractions or mass fractions of constituent gaseous and liquid hydrocarbon components, carbon dioxide, hydrogen sulfide, nitrogen, and water, viscosity and fluid density of these components, and reservoir pressure and reservoir temperature. Also, by way of example, the information fed to the simulator may include information describing the number and location of connections between the reservoir and the wellbore(s), information describing location and operation of flow control devices (if installed), such as chokes and valves, labyrinth devices, and downhole separators, between the reservoir and the wellbore(s), information describing the geometry of the wellbore(s), and possibly other information such as information regarding the EOR flooding methods or advanced production controls.

After parsing the information input in 110, the reservoir simulator 100 constructs one or more models that represent fluid flow in the reservoir and the connected wellbore(s). The model(s) include a system of discrete partial differential equations that models the fluid flow in the reservoir. The reservoir simulator 100 determines an approximate solution to the system of discrete partial differential equations for a time step n at 120 using Newton's method (Newton Iteration Solver 130). If the results of the Newton Iteration Solver 130 do not converge, a quality check 160 can be used to stop the process so that a reduced time step can be used at 170 and the process repeated for the reduced time step. However, where the results converge, the results for time step n are provided as output results at 180. The operations may then continue by stepping through time (n=n+1) at 185 and running the Newton Iteration Solver 130 for the next time step. Eventually, the results for all times of interest are assessed at 200 for suitability (e.g., return on investment). Changes can be made to the inputs at 210 and the operations of the reservoir simulator 100 repeated to evaluate different operational strategies. The reservoir simulator 100 can be configured to model and simulate EOR flooding of a reservoir where the reservoir is penetrated by one or more injector wells as well as one or more producer well(s). The injector well(s) is (are) configured to inject a displacing agent into the reservoir fluid, which flows through the reservoir toward the producing well(s) and pushes or displaces reservoir fluids such that reservoir fluids flow to the production well(s) for production to the surface. The simulation of the EOR flooding can be used to study, plan and/or optimize EOR drilling strategies (such as placement of the injector well(s) and/or producer well(s)) and/or EOR production strategies.

In embodiments, the reservoir simulator 100 may be a simulator such as the ECLIPSE® simulator of Schlumberger.

A key element of most of types of EOR flooding operations is a formation of a sharp advancing front of the displacing agent. It could simply be water aiming to displace hydrocarbons from the porous reservoir. It could be a polymer flooding to increase macroscopic sweep efficiency, or it could also be a chemical agent trying to mobilize oil on a microscopic level, by reducing critical saturations. The time of front arrival to the producing well has a significance for the production control. It indicates the end of hydrocarbon production for this well which affects the whole field economics.

Therefore, an accurate prediction of the time of flood front arrival is a key factor in screening and optimization workflows in the field development planning. To account for uncertainty in reservoirs with heterogeneous underlying geology, normally a large amount of numerical simulations is launched, with expectation to obtain quick answers. Here, the requirements that the simulation be both detailed for accuracy, and fast for timely results are in tension: greater model refinement will increase run time.

Figures 1A, 1B:
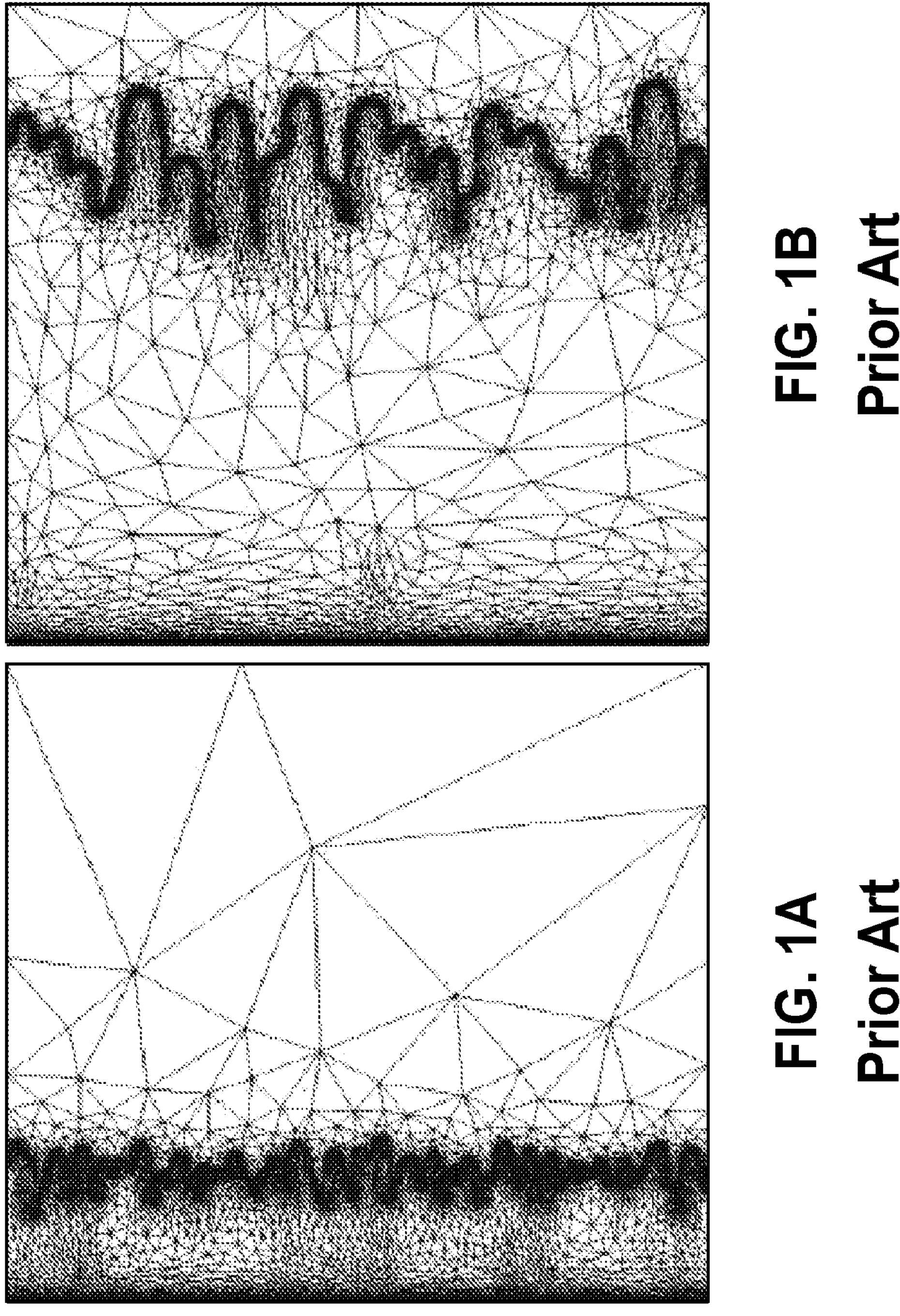
FIGS. 1A and 1B depict morphed triangular anisotropic meshes generated by the prior art CFVE method.
Figures 2A, 2B:
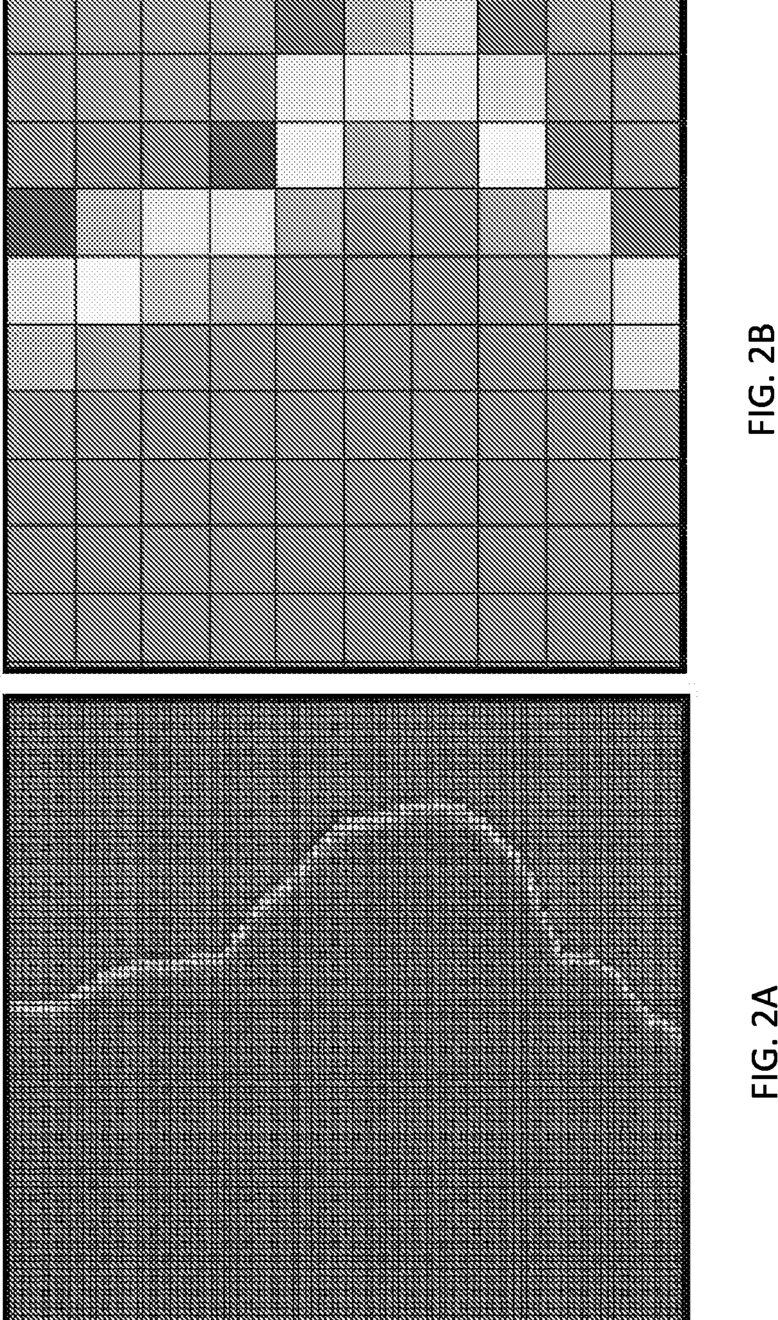
FIG. 2A depicts an aerial view of a reservoir undergoing EOR flooding as part of simulations that employ a fine grid, which is organized as a two-dimensional grid of 102×100 cells. This aerial view is constructed from the results of a reservoir simulator that is configured to simulate EOR flooding of the reservoir using the fine grid.
FIG. 2B depicts an aerial view of a reservoir undergoing EOR flooding as part of simulations that employ a coarse grid, which is organized as a two-dimensional grid of 12×10 cells. This aerial view is constructed from the results of a reservoir simulator that is configured to simulate EOR flooding of the reservoir using the course grid. The course grid of FIG. 2B is the result of upscaling of the fine grid of FIG. 2A. In both FIGS. 2A and 2B, the reservoir is penetrated by an injector well (not shown) on its left hand side and a producing well (not shown) on its right hand side. Both the injector well and the producing well extend vertically out of the page. The injector well is configured to inject a displacing agent into the reservoir. The front of the displacing agent propagates from the injector well to the producing well from left to right.

FIGS. 2A and 2B depict aerial views of a 2D reservoir undergoing EOR flooding as part of simulations that employ a fine grid and a coarse grid, respectively. The coarse grid of FIG. 2B (which is a grid of 12×10 cells) is the result of upscaling of the fine grid of FIG. 2A (which is a grid of 102×100 cells). In both FIGS. 2A and 2B, the reservoir is penetrated by an injector well (not shown) on its left hand side and a producing well (not shown) on its right hand side. Both the injector and producing wells for the two figures extend vertically out of the page. The front of the displacing agent propagates from left to right. The errors using the course grid are evident in FIG. 2B. More specifically, the front in the coarse grid simulation appears to arrive to the producing well on the right much earlier than in the fine grid simulation. This shows that commonly adopted upscaling procedures are failing in the presence of sharp fronts.

The present disclosure provides a workflow for modeling and simulating EOR flooding operations performed on a reservoir, which employs two major parts. First is the training of a machine learning system based on results of fine grid simulation of EOR flooding such that the trained machine learning system can accurately predict displacing agent front speed (or front transformation rate) and related front position and configuration given input data generated during course grid simulation of EOR flooding of a reservoir.

Training of the Machine Learning System

The reservoir simulator that is used to train the ML system as described herein should be capable of covering all possible variations of physical parameters variations that will be application to the workflow. Thus, the reservoir simulator should be refined enough to be trusted by minimizing numerical dispersion errors and reproducing fine scale geological features.

Figures 2C, 2D, 2E:
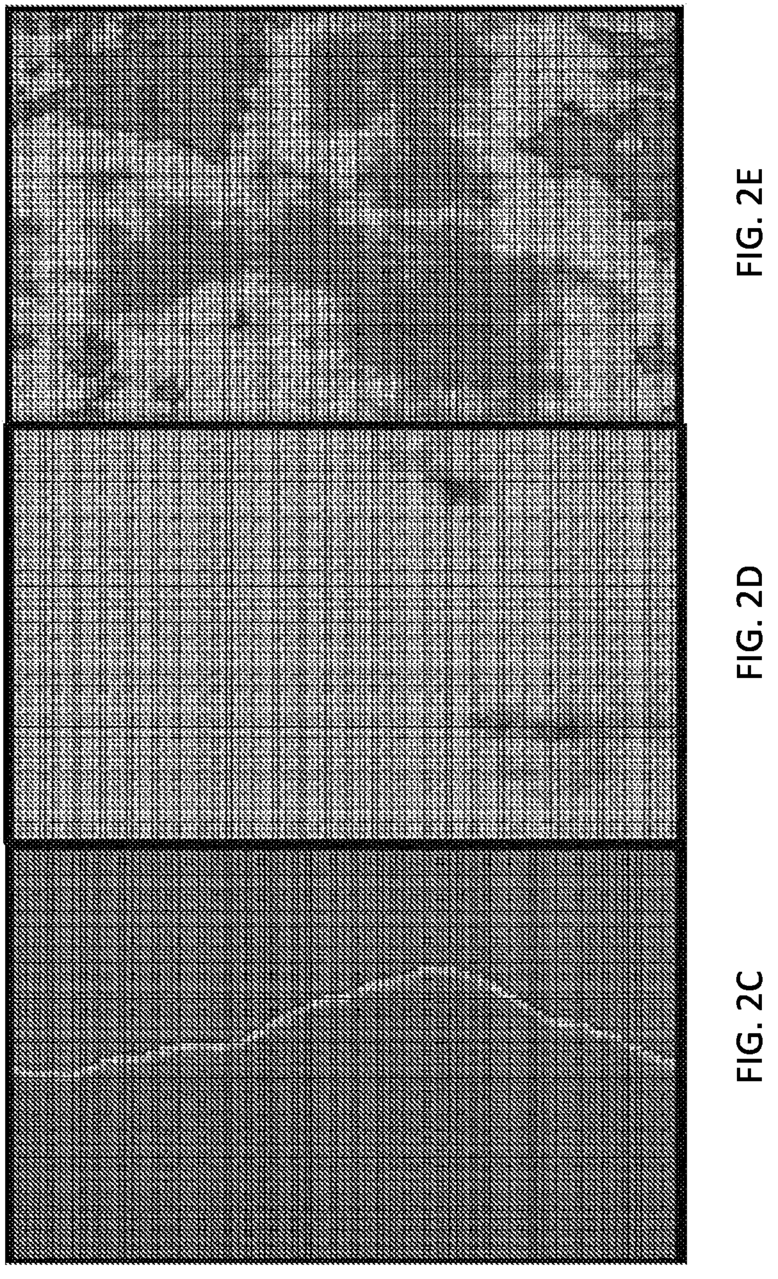
FIG. 2C represents an example spatial distribution of dispersion agent concentration (e.g., polymer concentration) as the result of EOR flooding simulation (e.g., polymer flooding) of a reservoir using a two-dimensional fine grid, which is organized as a two-dimensional grid of 102×100 cells.
FIG. 2D is a plot of pseudo-random spatial distribution of porosity of the reservoir over the two-dimensional grid of FIG. 2C.
FIG. 2E is a plot of pseudo-random distribution of permeability of the reservoir over the two-dimensional fine grid of FIG. 2C.

FIG. 2C represents an example spatial distribution of dispersion agent concentration (e.g., polymer concentration) as a result of EOR flooding simulation (e.g., polymer flooding) of a reservoir using a two-dimensional fine grid, which is organized as a two-dimensional grid of 102×100 cells. FIG. 2D is a plot of pseudo-random spatial distribution of porosity of the reservoir over the two-dimensional grid of FIG. 2C. FIG. 2E is a plot of pseudo-random distribution of permeability of the reservoir over the two-dimensional fine grid of FIG. 2C. In embodiments, such data can be collected and used to train a machine learning system to accurately predict displacing agent front speed (or front transformation rate) and related front position and configuration given input data generated during course grid simulation of EOR flooding of a reservoir.

The purpose of the training (or training stage) of the machine learning system is to establish a dependency for a certain upscaled domain of a reservoir, between a collection of static properties S and dynamic D properties averaged over this domain on one hand, and the displacing agent front speed (or front transformation rate) and related front position and configuration rate for the domain on the other hand.

Figure 4A:
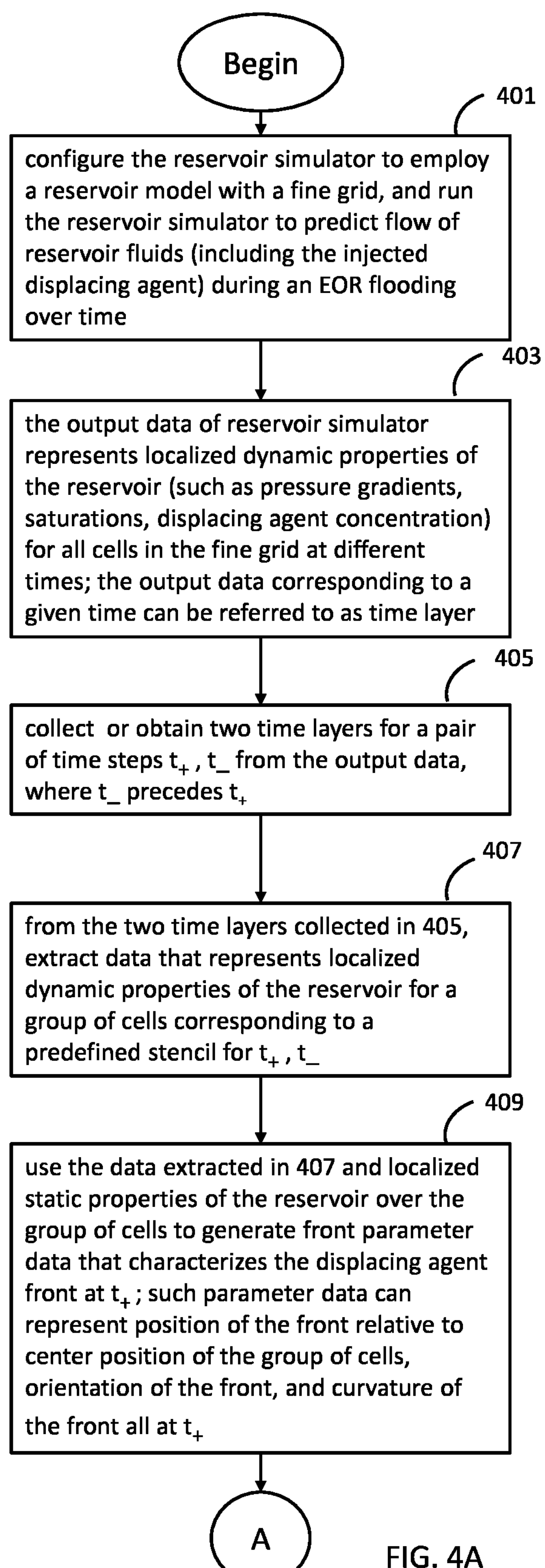
FIGS. 4A and 4B, collectively, is a flowchart that illustrates a training process for constructing and training a machine learning (ML) system, which can be part of the workflow of the present disclosure.
Figure 4B:
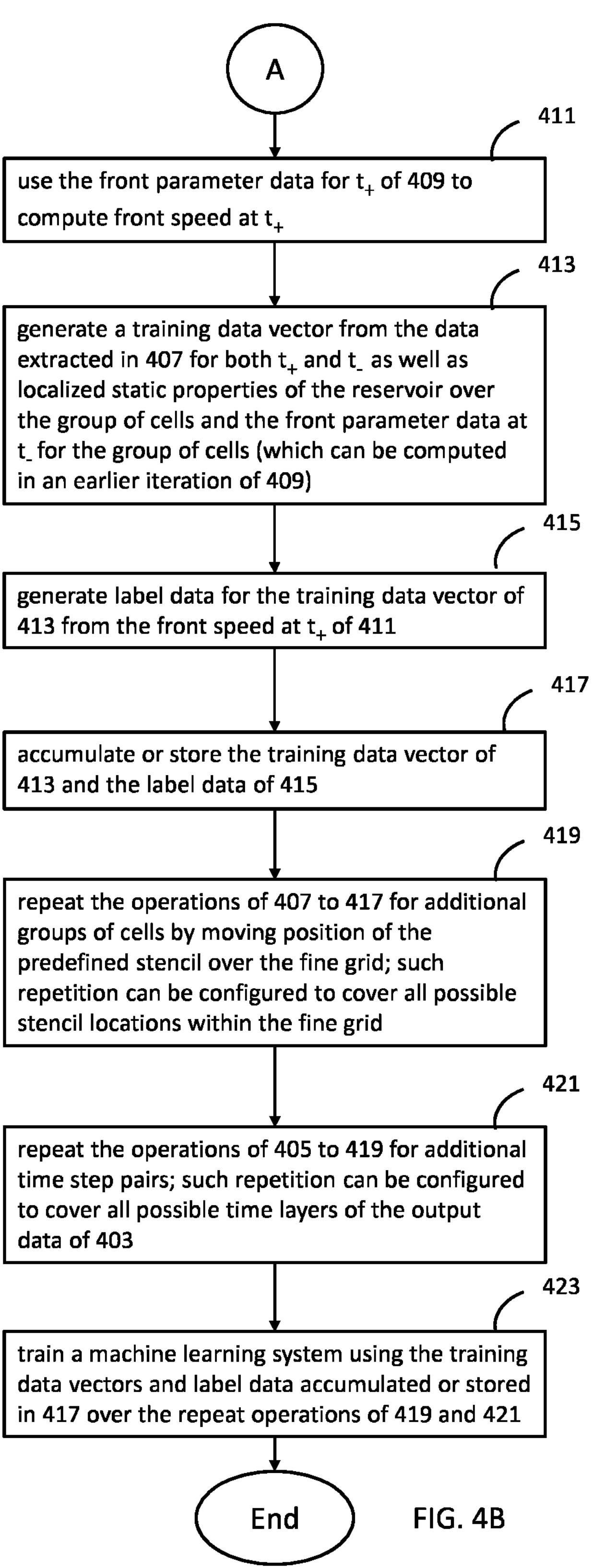

FIGS. 4A and 4B, collectively, is a flowchart that illustrates an embodiment of a training process for constructing and training a machine learning (ML) system for this purpose.

First, in block 401, a reservoir simulator (such as the reservoir simulator of FIG. 3) is configured to employ a reservoir model with a fine grid. The fine grid divides or discretizes the space encompassed by a reservoir or part thereof into a number of grid cells of relatively higher spatial resolution (or fine scale) as compared to a course grid which divides or discretizes the space encompassed by the reservoir or part thereof into number of grid cells of relatively lower spatial resolution (or course scale). Thus, for a given domain or part of the reservoir, the fine grid will have a higher spatial resolution and larger number of grid cells than the course grid. In block 401, the reservoir simulator is configured and run to predict the flow of reservoir fluids (including the displacing agent) during EOR flooding of a reservoir over time.

In block 403, the output data of the reservoir simulator from 401 represents localized dynamic properties of the reservoir (such as pressure gradients, reservoir fluid saturations, displacing agent concentration) for all cells in the fine grid of the reservoir model at different times of the EOR flooding. Note that the output data corresponding to a given time or time step can be referred to as time layer.

In block 405, two time layers for a pair of time steps $t_+$, $t_-$ can be collected or obtained from the output data of block 403. In this case, the time step $t_-$ precedes the time step $t_+$.

In block 407, data is extracted from the two time layers collected in 405 where the extracted data represents localized dynamic properties of the reservoir for a group of cells of the fine grid corresponding to a predefined stencil for the time steps $t_+$, $t_-$. The stencil represents a spatial grouping or geometry of adjacent cells in the fine grid. It can be logically positioned and overlaid on the cells of the fine grid to identify a corresponding group of adjacent cells in the fine grid. In one embodiment, the stencil can have cross shape that covers five adjacent grid cells, which include one cell at the center position of the stencil, one grid cell immediately above this center grid cell (in the Y direction), one grid cell immediately below this center grid cell (in the Y direction), one grid cell immediately left of this center grid cell (in the X direction), and one grid cell immediately right of this center grid cell (in the X direction). The geometry of this cross-shaped stencil allows for calculation of pressure gradients in X and Y directions as a subset of the dynamic properties. Other two-dimensional and three dimensional stencils can be used if desired.

In block 409, the data extracted in 407 and one or more localized static properties of the reservoir over the group of cells of the fine grid are used to generate front parameter data that characterizes the displacing agent front at the time step $t_+$. In embodiments, such front parameter data can represent a position of the displacing agent front relative to center position of the group of cells (i.e., the grid cell corresponding to the center cell of the stencil), orientation of the displacing agent front, and curvature of the displacing agent front, all at the time step $t_+$. These three quantities can be computed from actual front shape for the two time layers corresponding to the time steps $t_+$, $t_-$.

In block 411, the front parameter data for the time step $t_+$ of 409 is used to compute a front speed $FS_+$ for the time step $t_+$. The front speed $FS_+$ characterizes the speed or velocity of the front of displacing agent as it flows and advances through the reservoir at the time step $t_+$ during the EOR flooding operations.

In block 413, a training data vector is generated from the data extracted in 407 for both the time step $t_+$ and the time step $t_-$ as well as one or more localized static properties of the reservoir over the group of cells and the front parameter data at the time step $t_-$ for the group of cells (which can be computed in an earlier iteration of 409). The one or more localized static properties of the reservoir over the group of cells can represent porosity and/or anisotropic permeabilities (for example, permeabilities in X and Y directions), which can be upscaled from fine grid up to the central cell of the stencil, for example by averaging such properties for the central cell. The data extracted in 407 for both the time step $t_+$ and the time step $t_-$ represents localized dynamic properties (such as pressure gradients, fluids saturations and displacing agent concentration) for the group of cells for the two time steps $t_+$ and $t_-$.

In block 415, label data is generated for the training data vector of 413 where the label data represents the front speed $FS_+$ for the time step $t_+$ of 411.

In block 417, the training data vector of 413 and the label data of 415 are accumulated or stored for subsequent training (bock 423).

In block 419, the operations of 407 to 417 can be repeated for additional groups of cells by moving position of the predefined stencil over the fine grid. In embodiments, such repetition can be configured to cover all possible stencil locations within the fine grid.

In block 421, the operations of 405 to 419 can be repeated for additional time step pairs. In embodiments, such repetition can be configured to cover all possible time layers of the output data of 403.

In block 423, the training data vector data and the label data accumulated or stored in 417 over the repeat operations of 419 and 421 are used to train a machine learning system.

Figure 4C:
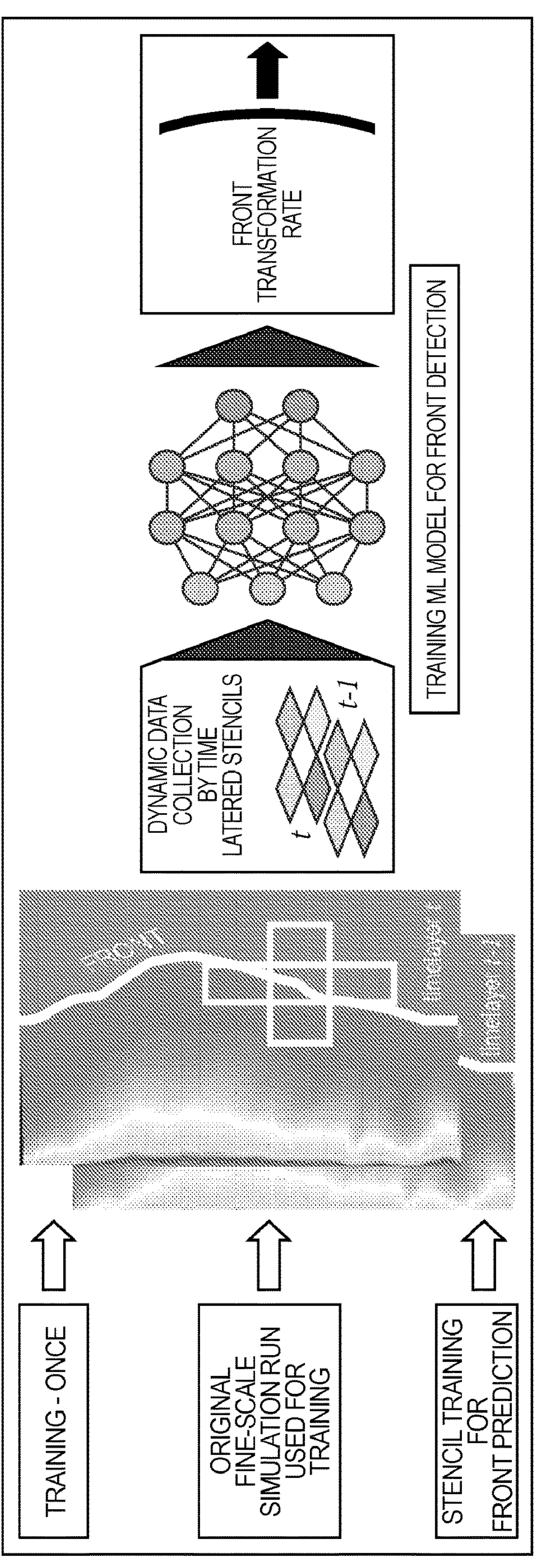
FIG. 4C is a schematic diagram that illustrates the training process of FIGS. 4A and 4B.

A schematic diagram that illustrates the training process of FIGS. 4A and 4B is shown in FIG. 4C.

In embodiments, the machine learning system of block 423 employs a computational model that is trained with training data to make predictions on unknown input data. Various types of computational models can be used, such as artificial neural networks (ANNs), decision trees and support vector machines. An artificial neural network is an interconnected group of units or nodes called "artificial neurons", which loosely model the neurons in a biological brain. Each connection, like the synapses in a biological brain, can transmit information, a "signal", from one artificial neuron to another. An artificial neuron that receives a signal can process it and then signal additional artificial neurons connected to it. In common ANN implementations, the signal at a connection between artificial neurons is a real number, and the output of each artificial neuron is computed by some non-linear function of the sum of its inputs. The connections between artificial neurons are called "edges". Artificial neurons and edges typically have a weight that adjusts as training or learning proceeds. The weight increases or decreases the strength of the signal at a connection. Artificial neurons may have a threshold such that the signal is only sent if the aggregate signal crosses that threshold. Typically, artificial neurons are aggregated into layers. Different layers may perform different kinds of transformations on their inputs. Signals travel from the first layer (the input layer) to the last layer (the output layer), possibly after traversing the layers multiple times.

In embodiments, the machine learning system of block 423 can be trained by the Random Forest algorithm as:

$$FS_+ = T(F_-, S, D_-, D_+, t_+ - t_-). \qquad \text{Eqn. (1)}$$

where $FS_+$ is front speed at the $t_+$ timestep as predicted by the machine learning system and provided by the label data, $F_-$ is the front parameter data (e.g., position, orientation, curvature of the displacing agent front) at the time step $t_-$ and part of the training data vector, S are localized static properties of the reservoir (e.g., porosity $\varphi$, and X and Y permeabilities $K_x$ and $K_y$) and part of the training data vector, and $D_+$ and $D_-$ are localized dynamic properties of the reservoir (e.g., X and Y pressure gradients, fluid saturations, and displacing agent concentration) at the $t_+$ timestep and the $t_-$ timestep, respectively, and part of the training data vector. The Random Forest algorithm is a popular machine learning algorithm that belongs to the supervised learning technique. It is based on the concept of ensemble learning, which is a process of combining multiple classifiers to solve a complex problem and to improve the performance of the computational model. Typically, the Random Forest model contains a number of classifiers that are trained on various subsets of a given dataset and combines or averages the output predicted by the number of classifiers to improve the predictive accuracy of that dataset. Thus, instead of relying on one classifier, the random forest model takes the prediction from multiple classifiers and combines such predictions to produce its final predicted output. In embodiments, the Random Forest algorithm can be used to train the machine learning system to low levels of training and validation errors.

In embodiments, the trained machine learning system can be configured to provide an answer to the following question with a high level of confidence: "Given static and dynamic properties of the reservoir around the front at two timesteps, and front parameters at timestep $t_-$, what is the front speed to take it to new position at time $t_+$?"

Figure 5:
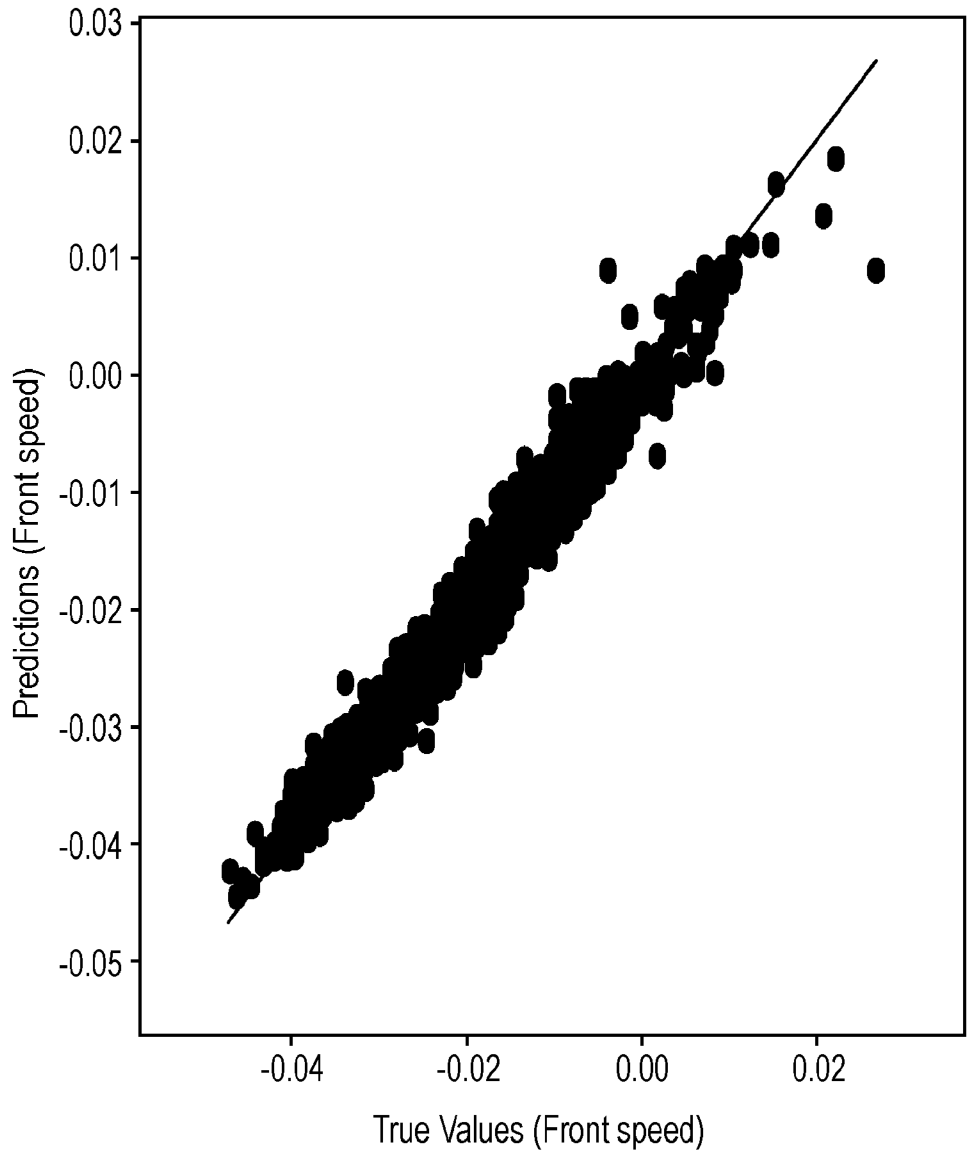
FIG. 5 is a plot of front speed predictions generated by the trained ML system as a function of true front speed, wherein exact prediction is the diagonal line shown in FIG. 5.

FIG. 5 illustrates the predictivity of the trained machine learning model with error value around 1e-5. Exact prediction is the diagonal line shown in FIG. 5.

As a result, the trained machine learning system is ready to be used in conjunction with a coarse grid simulation process, where static and dynamic data are extracted from the course grid simulation and used as input to the trained machine learning system to predict front propagation and refine front propagation and improve the accuracy of the course grid simulation process.

Machine Learning Simulation (ML SIM) Process

Figure 6A:
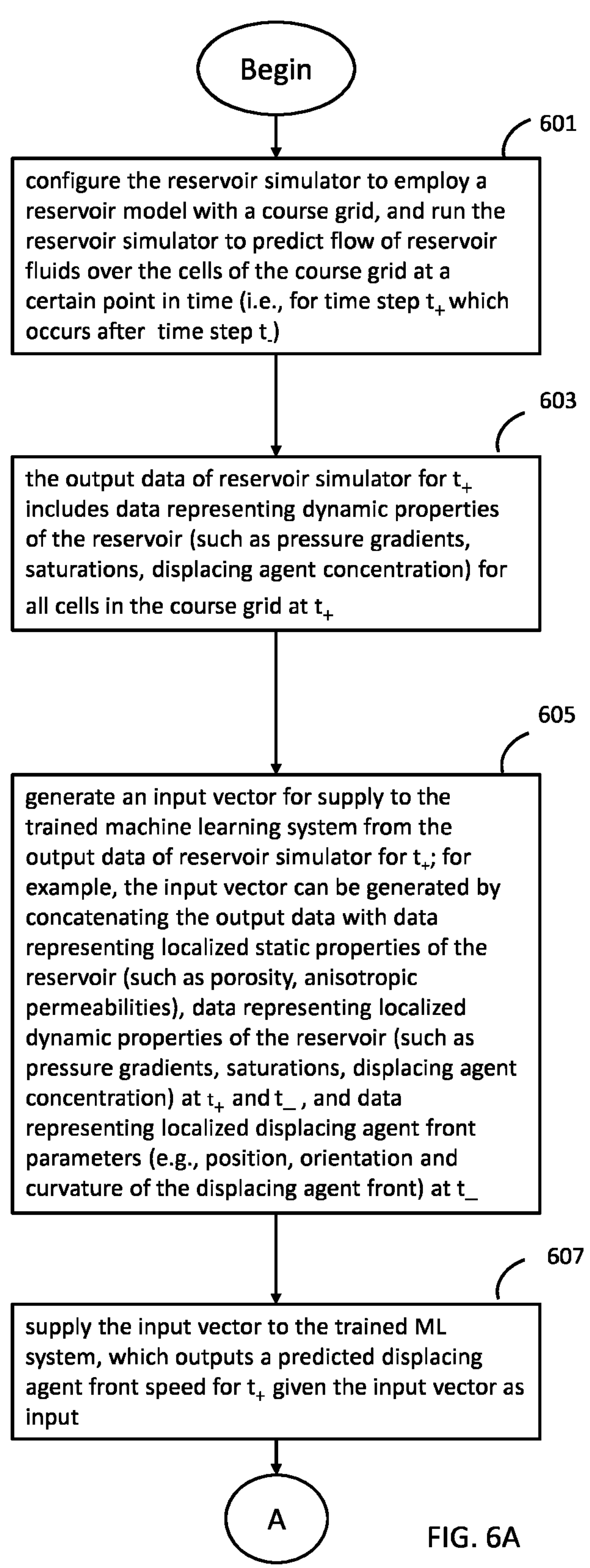
FIGS. 6A and 6B, collectively, is a flowchart that illustrates a workflow that utilizes the machine learning system that results from the training process of FIGS. 4A, 4B and 4C in combination with course grid simulation of a reservoir undergoing EOR flooding to improve the accuracy of the course grid simulation.
Figure 6B:
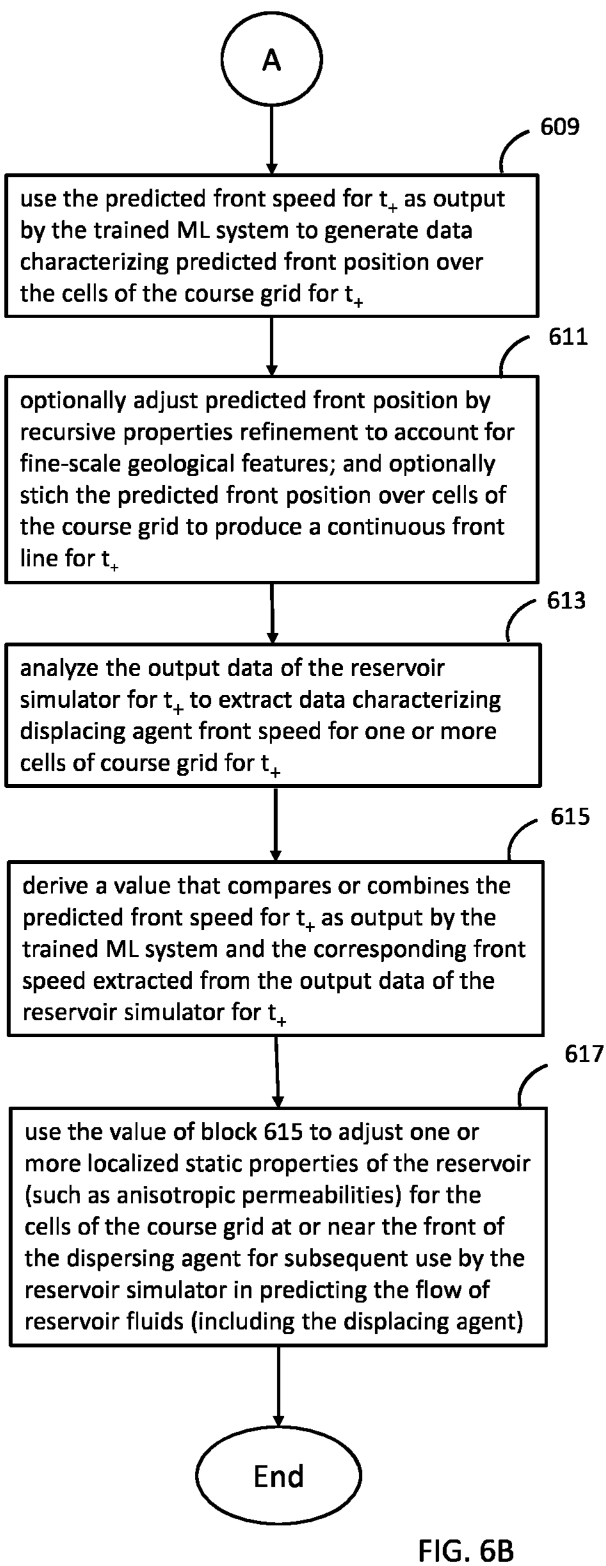

The main elements of the ML-driven simulation (ML SIM) process are presented in the flow chart of FIGS. 6A and 6B, which begins in block 601 where a reservoir simulator (e.g., the reservoir simulator of FIG. 3) is configured to employ a reservoir model with a course grid. As described above, for a given domain or part of a reservoir, the course grid will have a lower spatial resolution and lesser number of grid cells than the fine grid used to train the ML system. In block 601, the reservoir simulator is run to predict flow of reservoir fluids (including the displacing agent) over the cells of the course grid at a certain point in time (i.e., for a time step $t_+$ which occurs after a time step $t_-$).

In block 603, the output data of reservoir simulator from 601 includes data representing localized dynamic properties of the reservoir (such as X and Y pressure gradients, fluid saturations, and displacing agent concentration) for all cells in the course grid at the time step $t_+$.

In block 605, an input vector is generated for supply to trained machine learning system from the output data of reservoir simulator for the time step $t_+$ of 603. For example, the input vector can be generated by concatenating the output data for a course grid cell with data representing localized static properties of the reservoir (e.g., porosity $\varphi$ and X and Y permeabilities $K_x$ and $K_y$ at the course grid cell) and data representing localized dynamic properties of the reservoir (e.g., X and Y pressure gradients, fluid saturations, and displacing agent concentration at the course grid cell) at the $t_+$ time step and the $t_-$ timestep, and data representing parameters of the displacing agent front (e.g., position, orientation and curvature of the displacing agent front at the course grid cell) at the $t_-$ timestep.

In block 607, the input vector of block 605 can be supplied to the trained ML system (trained in block 423), which outputs a predicted displacing agent front speed $FS_+$ for the time step $t_+$ given the input vector as input.

The operations of blocks 605 and 607 can be repeated over one or more cells of the course grid to predict displacing agent front speed $FS_+$ at one or more cells of the course grid for the time step $t_+$.

In block 609, the predicted front speed $FS_+$ at one or more cells of the course grid for the time step $t_+$ as output by the trained ML system can be used generate data characterizing predicted front position over the cells of the course grid for the time step $t_+$.

In block 611, the predicted front position can optionally be adjusted by recursive properties refinement to account for fine-scale geological features. Furthermore, the predicted front position over cells of the course grid can optionally be stitched together to produce a continuous front line for the time step $t_+$.

In block 613, the output data of the reservoir simulator for the time step $t_+$ of 603 can be analyzed to extract data characterizing displacing agent front speed (which is referred to herein as $$FS_+^{coarse}$$

for one or more cells of course grid for the time step $t_+$. The front speed $$FS_+^{coarse}$$

characterizes the speed or velocity of the front of displacing agent as it flows and advances through the reservoir at the time step $t_+$ during the EOR flooding operations.

In block 615, a value can be derived that compares or combines the predicted front speed $FS_+$ at one or more cells of the course grid for the time step $t_+$ as output by the trained ML system (block 607) and a corresponding front speed $$FS_+^{coarse}$$

extracted from the output data of the reservoir simulator over the cells of course grid for the time step $t_+$ (block 611). For example, the value can be a ratio of the predicted front speed $FS_+$ at a cell of the course grid for the time step $t_+$ (block 607) and the corresponding front speed $$FS_+^{coarse}$$

of the same cell of the course grid extracted from the output data of the reservoir simulator for the time step $t_+$ (block 611).

In block 617, the value of block 615 can be used to adjust one or more localized static properties of the reservoir (such as anisotropic permeabilities) for one or more cells of the course grid at or near the front of the dispersing agent for subsequent use by the reservoir simulator in predicting the flow of reservoir fluids (including the displacing agent). Such adjustments can be configured to refine front propagation and improve the accuracy of the course grid simulation process for the time step $t_+$ or possibly future time steps (i.e., subsequent in time to the time step $t_+$).

Figure 7:
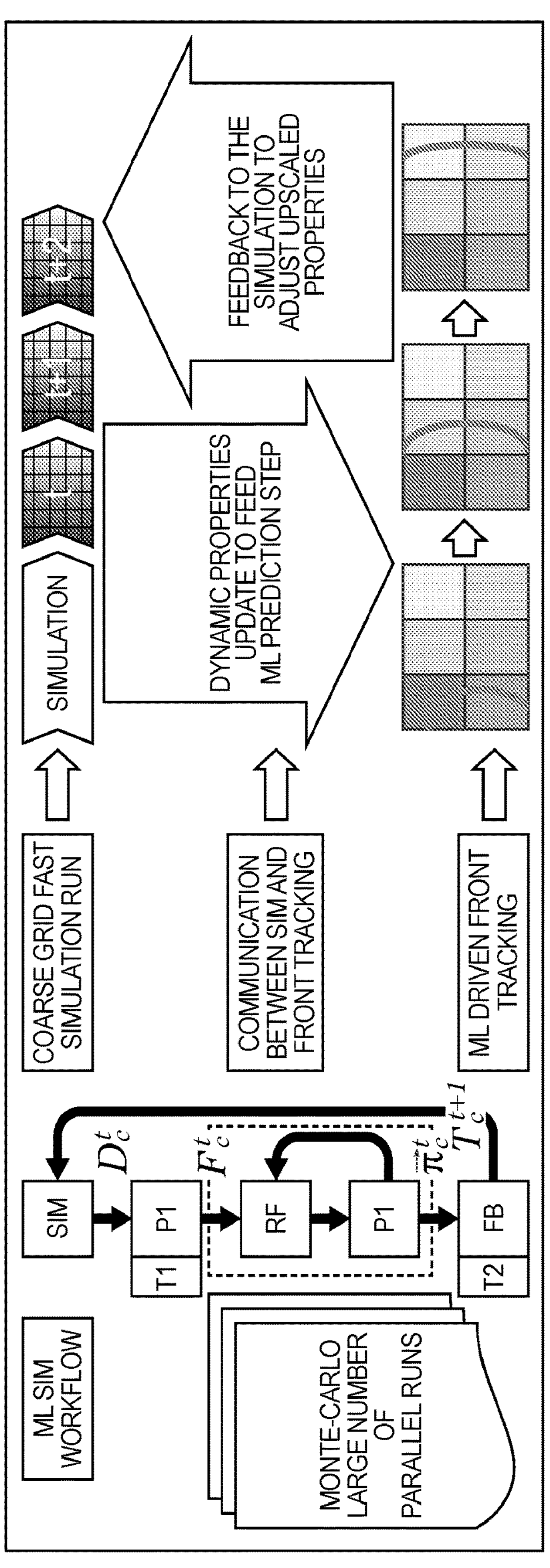
FIG. 7 is a schematic diagram of the workflow of FIGS. 6A and 6B.

FIG. 7 is a schematic diagram of the workflow of FIGS. 6A and 6B, which depicts the following operations:

1. Coarse grid simulation runs until a certain point in time (e.g., time step $t_+$). The output of the coarse grid simulation includes the set of dynamic properties for all cells of the course grid.

2. An input vector is generated by concatenating the dynamic properties of the reservoir at a grid cell with the static properties of the reservoir at the grid cell and the dynamic properties of the reservoir at the grid cell for the earlier time step $t_-$ and front characteristics at the grid cell at the earlier time step $t_-$.
3. The input vector is supplied as input to the trained ML system, which has enough information to predict front speed and therefore, front position at the time step $t_+$.
4. The predicted front position can be adjusted by recursive properties refinement to account for fine-scale geological features.
5. The individual predictions for front position over the cells of the coarse grid can be stitched to produce a continuous front line.
6. The results of the coarse grid simulation is analyzed to extract the coarse grid front speed $$FS_+^{coarse}$$

for one or more cells of the course grid for the time step $t_+$, which can be compared to the corresponding predicted front speed $FS_+$ for one or more cells of the course grid. Their ratio can be used to adjust or scale one or more localized static properties of the reservoir (such as one or more anisotropic permeabilities) for one or more corresponding cells of the course grid used in the course grid simulation for the time step $t_+$ or possibly future time steps.

The last step of adjusting one or more localized static properties of the reservoir (such as one or more anisotropic permeabilities) in stage 6 represents a final step in completing the coarse grid upscaling in the presence of sharp fronts. While other coarse grid cells properties are correctly upscaled, the presence of the advancing front introduces errors which are rectified by the trained ML system, which has as an objective the goal to reproduce the front speed with high accuracy compared with the benchmark fine grid simulation.

The application of the trained ML system for the coarse grid simulation process has two main outcomes:

Front tracking with accurate front position prediction

Dynamic modification of the coarse grid properties as a front driven upscaling adjustment In embodiments, the workflow of the present disclosure can be used as part of a tool, which will be controlling synchronized operation of coarse grid simulation and front tracking. It can be used for uncertainty and optimization workflows, history matching, screening etc. that involves simulation and modeling of EOR flooding operations.

Figure 8:
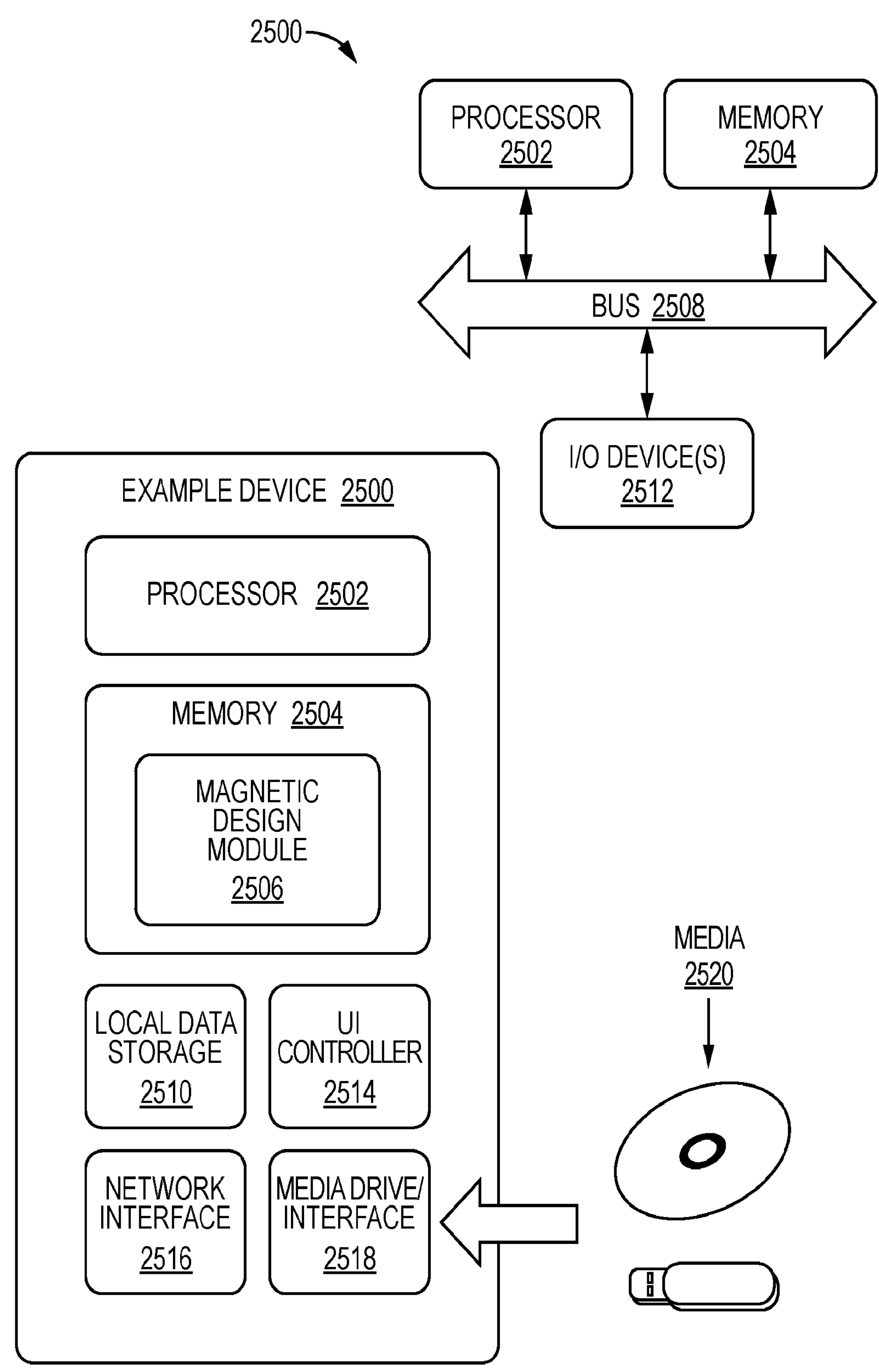
FIG. 8 is a schematic block diagram of an example computer system.

FIG. 8 illustrates an example device 2500, with a processor 2502 and memory 2504 that can be configured to implement various embodiments of the methods and systems for modeling and simulation of EOR flooding as discussed in this disclosure. Memory 2504 can also host one or more databases and can include one or more forms of volatile data storage media such as random-access memory (RAM), and/or one or more forms of nonvolatile storage media (such as read-only memory (ROM), flash memory, and so forth).

Device 2500 is one example of a computing device or programmable device and is not intended to suggest any limitation as to scope of use or functionality of device 2500 and/or its possible architectures. For example, device 2500 can comprise one or more computing devices, programmable logic controllers (PLCs), etc.

Further, device 2500 should not be interpreted as having any dependency relating to one or a combination of components illustrated in device 2500. For example, device 2500 may include one or more of computers, such as a laptop computer, a desktop computer, a mainframe computer, etc., or any combination or accumulation thereof.

Device 2500 can also include a bus 2508 configured to allow various components and devices, such as processors 2502, memory 2504, and local data storage 2510, among other components, to communicate with each other.

Bus 2508 can include one or more of any of several types of bus structures, including a memory bus or memory controller, a peripheral bus, an accelerated graphics port, and a processor or local bus using any of a variety of bus architectures. Bus 2508 can also include wired and/or wireless buses.

Local data storage 2510 can include fixed media (e.g., RAM, ROM, a fixed hard drive, etc.) as well as removable media (e.g., a flash memory drive, a removable hard drive, optical disks, magnetic disks, and so forth).

One or more input/output (I/O) device(s) 2512 may also communicate via a user interface (UI) controller 2514, which may connect with I/O device(s) 2512 either directly or through bus 2508.

In one possible implementation, a network interface 2516 may communicate outside of device 2500 via a connected network.

A media drive/interface 2518 can accept removable tangible media 2520, such as flash drives, optical disks, removable hard drives, software products, etc. In one possible implementation, logic, computing instructions, and/or software programs comprising elements of module 2506 may reside on removable media 2520 readable by media drive/interface 2518. Various processes of the present disclosure or parts thereof can be implemented by instructions and/or software programs that are elements of module 2506. Such instructions and/or software programs may reside on removable media 2520 readable by media drive/interface 2518 as is well known in the computing arts.

In one possible embodiment, input/output device(s) 2512 can allow a user (such as a human annotator) to enter commands and information to device 2500, and also allow information to be presented to the user and/or other components or devices. Examples of input device(s) 2512 include, for example, sensors, a keyboard, a cursor control device (e.g., a mouse), a microphone, a scanner, and any other input devices known in the art. Examples of output devices include a display device (e.g., a monitor or projector), speakers, a printer, a network card, and so on.

Various processes of the present disclosure may be described herein in the general context of software or program modules, or the techniques and modules may be implemented in pure computing hardware. Software generally includes routines, programs, objects, components, data structures, and so forth that perform particular tasks or implement particular abstract data types. An implementation of these modules and techniques may be stored on or transmitted across some form of tangible computer-readable media. Computer-readable media can be any available data storage medium or media that is tangible and can be accessed by a computing device. Computer readable media may thus comprise computer storage media. "Computer storage media" designates tangible media, and includes volatile and non-volatile, removable and non-removable tangible media implemented for storage of information such as computer readable instructions, data structures, program modules, or other data. Computer storage media include, but are not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other tangible medium which can be used to store the desired information, and which can be accessed by a computer. Some of the methods and processes described above, can be performed by a processor. The term "processor" should not be construed to limit the embodiments disclosed herein to any particular device type or system. The processor may include a computer system. The computer system may also include a computer processor (e.g., a microprocessor, microcontroller, digital signal processor, or general-purpose computer) for executing any of the methods and processes described above.

Some of the methods and processes described above, can be implemented as computer program logic for use with the computer processor. The computer program logic may be embodied in various forms, including a source code form or a computer executable form. Source code may include a series of computer program instructions in a variety of programming languages (e.g., an object code, an assembly language, or a high-level language such as C, C++, or JAVA). Such computer instructions can be stored in a non-transitory computer readable medium (e.g., memory) and executed by the computer processor. The computer instructions may be distributed in any form as a removable storage medium with accompanying printed or electronic documentation (e.g., shrink wrapped software), preloaded with a computer system (e.g., on system ROM or fixed disk), or distributed from a server or electronic bulletin board over a communication system (e.g., the Internet or World Wide Web).

Alternatively or additionally, the processor may include discrete electronic components coupled to a printed circuit board, integrated circuitry (e.g., Application Specific Integrated Circuits (ASIC)), and/or programmable logic devices (e.g., a Field Programmable Gate Arrays (FPGA)). Any of the methods and processes described above can be implemented using such logic devices.

Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims. In the claims, means-plus-function clauses, if any, are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112, paragraph 6 for any limitations of any of the claims herein, except for those in which the claim expressly uses the words 'means for' together with an associated function.

What is claimed is:

1. A method of modeling or simulating enhanced-oil recovery (EOR) flooding operations performed on a reservoir, comprising:

collecting training data based on simulation of EOR flooding operations using a first grid having a relatively high resolution;

using the training data to configure and train a machine learning system;

performing simulation of EOR flooding operations using a second grid having a relatively low resolution than the relatively high resolution of the first grid; and using output data generated by the simulation using the second grid as input to the machine learning system to predict at least one parameter characterizing a displacing agent front in the second grid for a time step in the simulation using the second grid, wherein the at least one parameter characterizing the displacing agent front comprises a front speed for the time step and the front speed is used during execution of the simulation using the second grid to adjust reservoir simulation parameters associated with at least one cell of the second grid, wherein the reservoir simulation parameters are used to compute a subsequent time step of the simulation using the second grid.

2. A method according to claim 1, wherein:

the first grid has a relatively fine resolution and the second grid has a relatively coarse resolution.

3. A method according to claim 1, wherein:

the machine learning system is trained to predict the front speed for the time step given at least one localized static property of the reservoir, at least one localized dynamic property of the reservoir at the time step provided by the simulation using the second grid, and at least one localized dynamic property of the reservoir at an earlier time step provided by the simulation using the second grid.

4. A method according to claim 3, wherein:

the at least one localized static property of the reservoir is selected from the group consisting of porosity and anisotropic permeabilities of the reservoir at a cell of the second grid.

5. A method according to claim 3, wherein:

the at least one localized dynamic property of the reservoir at the time step is selected from the group consisting of anisotropic pressure gradients, fluid saturations and displacing agent concentration at a cell of the second grid at the time step; and the at least one localized dynamic property of the reservoir at the earlier time step is selected from the group consisting of anisotropic pressure gradients, fluid saturations and displacing agent concentration at the cell of the second grid at the earlier time step.

6. A method according to claim 3, wherein:

the machine learning system is trained to predict the front speed for the time step given front parameter data from an earlier time step.

7. A method according to claim 6, wherein:

the front parameter data represents at least one of position of the displacing agent front relative to center position of the group of cells, orientation of the front, or curvature of the front at the earlier time step.

8. A method according to claim 1, wherein:

the machine learning system is trained using label data representing front speed based on front parameter data derived from the simulation of EOR flooding operations using the first grid having a relatively high resolution.

9. A method according to claim 1, further comprising:

adjusting front position in the second grid based on recursive properties refinement to account for fine-scale geological features of the reservoir.

10. A method according to claim 1, further comprising: combining predictions of front position for multiple cells of the second grid to produce a continuous front line.

11. A method according to claim 1, further comprising: extracting coarse grid front speed for the time step from the simulation using the second grid; and using the front speed for the time step as predicted by the machine learning system and the coarse grid front speed to update at least one localized static property of the reservoir.

12. A method according to claim 11, wherein: the at least one localized static property of the reservoir comprises anisotropic permeability of the reservoir at one or more cells of the second grid.

13. A method according to claim 1, wherein: the machine learning system is trained using a random forest algorithm.

14. A method according to claim 1, wherein: the training data is based on at least one localized static property of the reservoir derived by upscaling data representing the at least one static property for a group of adjacent cells of the first grid, wherein the group of adjacent cells of the first grid is defined by a predefined stencil.

15. A method according to claim 14, wherein: the at least one localized static property is selected from the group consisting of porosity and anisotropic permeabilities of the reservoir.

16. A method according to claim 1, wherein: the training data is based on at least one localized dynamic property of the reservoir derived by upscaling data representing the at least one dynamic property for a group of adjacent cells of the first grid for a respective time steps of a pair of time steps, wherein the group of adjacent cells of the first grid is defined by a predefined stencil.

17. A method according to claim 16, wherein: the at least one localized dynamic property is selected from the group consisting of pressure gradients, fluid saturations, and displacing agent concentration.

18. A method according to claim 1, which is performed by at least one processor.

19. A method according to claim 1, wherein: the training data is based on output data of a reservoir simulator that is configured to simulate EOR flooding operations using the first grid having a relatively high resolution; and the simulation using the second grid is performed by a reservoir simulator configured to simulate EOR flooding operations using the second grid having a relatively low resolution.

20. A system for modeling enhanced-oil recovery (EOR) flooding operations performed on a reservoir, comprising:
at least one processor configured to:
perform simulation of enhanced-oil recovery (EOR) flooding operations using a first grid having a relatively low resolution; and
use output data generated by the simulation as input to a machine learning system to predict at least one parameter characterizing a displacing agent front in the first grid for a time step in the simulation, wherein the at least one parameter characterizing the displacing agent front comprises a front speed for the time step and the front speed is used during execution of the simulation to adjust reservoir simulation parameters associated with at least one cell of the first grid, wherein the reservoir simulation parameters are used to compute a subsequent time step of the simulation,
wherein the machine learning system is trained on training data collected from simulation of EOR flooding operations using a second grid having a relatively high resolution.

21. A system according to claim 20, wherein: the machine learning system is trained to predict the front speed for the time step given at least one localized static property of the reservoir, localized dynamic properties of the reservoir at the time step provided by the simulation using the first grid, and localized dynamic properties of the reservoir at an earlier time step provided by the simulation using the first grid.

22. A system according to claim 21, wherein: the machine learning system is trained to predict the front speed for the time step given front parameter data from an earlier time step.

23. A system according to claim 22, wherein: the front parameter data represents at least one of position of the front relative to center position of the group of cells, orientation of the front, or curvature of the front at the earlier time step.

24. A system according to claim 20, further comprising: extracting coarse grid front speed for the time step from the simulation using the first grid; and using the front speed for the time step as predicted by the machine learning system and the coarse grid front speed to update at least one localized static property of the reservoir.

25. A system according to claim 24, wherein: the at least one localized static property of the reservoir comprises anisotropic permeability of the reservoir at one or more cells of the grid.

26. A system according to claim 20, wherein: the simulation using the first grid is performed by a reservoir simulator configured to simulate EOR flooding operations using the first grid having a relatively low resolution.

27. A method of modeling or simulating enhanced-oil recovery (EOR) flooding operations performed on a reservoir, comprising:
collecting training data based on simulation of EOR flooding operations using a first grid having a relatively high resolution;
using the training data to configure and train a machine learning system;
performing simulation of EOR flooding operations using a second grid having a relatively low resolution than the relatively high resolution of the first grid, wherein a resolution of the second grid is maintained during execution of the simulation using the second grid; and
using output data generated by the simulation using the second grid as input to the machine learning system to predict at least one parameter characterizing a displacing agent front in the second grid for a time step in the simulation using the second grid, wherein the at least one parameter characterizing the displacing agent front comprises a front speed for the time step and the front speed is used during execution of the simulation using the second grid to adjust reservoir simulation parameters associated with at least one cell of the second grid, wherein the reservoir simulation parameters are used to compute a subsequent time step of the simulation using the second grid.

* * * * *